United States Patent [19]

Ramsey

[11] 4,339,676

[45] Jul. 13, 1982

[54] LOGIC CIRCUIT HAVING A SELECTABLE OUTPUT MODE

[75] Inventor: Richard A. Ramsey, Houston, Tex.

[73] Assignee: Texas Instruments Incorporated, Dallas, Tex.

[21] Appl. No.: 66,209

[22] Filed: Aug. 13, 1979

[51] Int. Cl.³ ............... H03K 19/003; H03K 19/013; H03K 19/088

[52] U.S. Cl. ................... 307/473; 307/456; 307/458; 307/300; 307/299 B

[58] Field of Search ............... 307/456–458, 307/470, 473, 474, 270, 280, 300, 299 A, 299 B

[56] References Cited

U.S. PATENT DOCUMENTS

| | | | |
|---|---|---|---|
| 3,736,572 | 5/1973 | Tu | 307/456 X |
| 3,980,898 | 9/1976 | Priel | 307/473 |
| 3,999,080 | 12/1976 | Weathersby, Jr. et al. | 307/456 |
| 4,081,695 | 3/1978 | Allen et al. | 307/280 X |
| 4,194,132 | 3/1980 | Mrazek | 307/473 |
| 4,255,670 | 3/1981 | Griffith | 307/299 B X |
| 4,287,433 | 9/1981 | Goodspeed | 307/473 |

OTHER PUBLICATIONS

Mrazek, "Characteristics and Applications of Tri-State IC's", National Semiconductor Corp. (pub.), 7/1971, 11 pages.

Primary Examiner—Larry N. Anagnos
Attorney, Agent, or Firm—Robert C. Mayes; Gary C. Honeycutt; Melvin Sharp

[57] ABSTRACT

An improved logic circuit is disclosed, having an improved disable circuit for disabling the logic circuit at a substantially reduced current level. A modified form of the disable circuit enables the logic circuit to operate either in a three-state mode or in an open-collector mode, as desired. A dynamic Miller shunt is also disclosed for rapidly forcing the active drive device into the non-conducting state each time the phase splitter device assumes the non-conducting state. In addition, an active Miller shunt is disclosed for maintaining the active drive device in the non-conducting state whenever the logic circuit is disabled.

2 Claims, 2 Drawing Figures

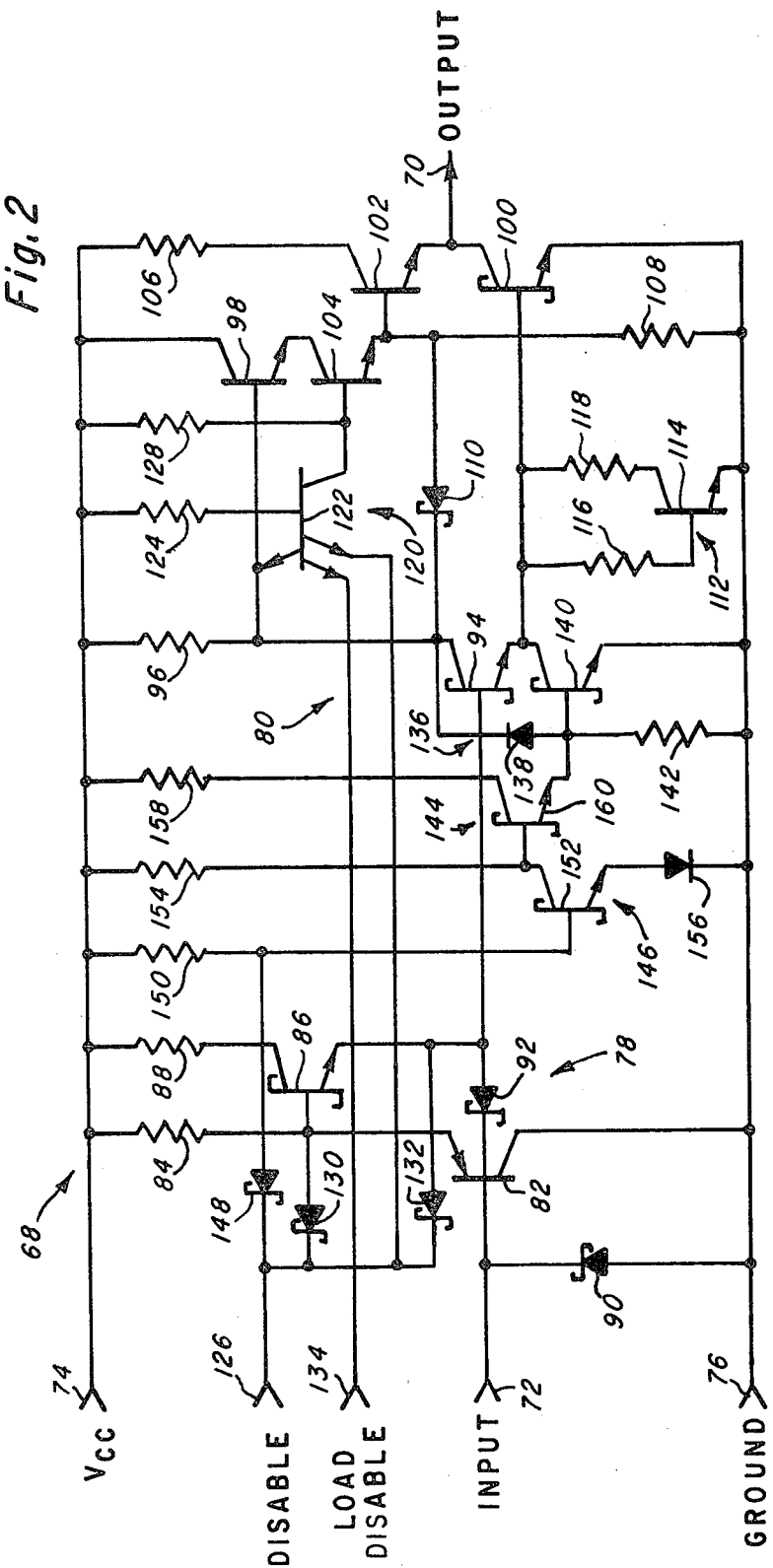

LOGIC CIRCUIT HAVING A SELECTABLE OUTPUT MODE

CROSS-REFERENCE TO RELATED APPLICATIONS

Related subject matter is contained in the following U.S. pat. applications, filed by the applicant simultaneously herewith and assigned to the assignee of the present application:

U.S. patent application Ser. No. 66,208, filed Aug. 13, 1979, entitled "AN IMPROVED LOGIC CIRCUIT HAVING AN IMPROVED DISABLE CIRCUIT";

U.S. pat. application Ser. No. 66,259, filed Aug. 13, 1979, entitled "AN IMPROVED LOGIC CIRCUIT HAVING AN ACTIVE MILLER SHUNT"; and U.S. pat. application Ser. No. 66,260, filed Aug. 13, 1979, entitled "AN IMPROVED LOGIC CIRCUIT HAVING A DYNAMIC MILLER SHUNT".

BACKGROUND OF THE INVENTION

1. FIELD OF THE INVENTION

The present invention relates generally to an improved logic circuit and, more particularly, to an improved logic circuit having a selectable output mode.

2. DESCRIPTION OF THE PRIOR ART

Shown by way of example in FIG. 1 is a logic circuit which has been used in the past in bipolar integrated circuits to provide a predetermined output signal in response to simultaneously receiving one or more input signals. In the form shown in FIG. 1, the logic circuit 10 operates as an inverter by applying an output signal to an output terminal 12 which is the logical inverse of an input signal applied to an input terminal 14. As is common with such circuits, the logic circuit 10 is supplied with operating power from a power source (not shown) coupled to a power terminal 16 and a ground terminal 18.

In general, the logic circuit 10 is comprised of an input circuit 20 and a output circuit 22. In the input circuit 20, a PNP input device 24 selectively applies phase splitter drive current provided by a phase splitter drive current source resistor 26 to the output circuit 22 via a PN phase splitter driver diode 28, depending upon the input signal applied to the input terminal 14. More particularly, the input device 24 will assume a conducting state in response to a relatively low voltage input signal applied to the input terminal 14, so that substantially all of the phase splitter drive current provided by the phase splitter drive current source resistor 26 is shunted to the ground terminal 18. On the other hand, the input device 24 will assume a non-conducting state in response to a relatively high voltage input signal applied to the input terminal 14, so that the phase splitter drive current is applied to the output circuit 22 via the phase splitter driver diode 28. In the preferred form of such circuits, a Schottky input clamp diode 30 is interposed between the ground terminal 18 and the input terminal 14 to establish a low voltage input signal clamping level, and a Schottky phase splitter speed-up diode 32 is interposed between the output circuit 22 and the input terminal 14 to improve the response time of the output circuit 22 to changes in the state of the input signal applied to the input terminal 14.

In the output circuit 22, a Schottky-clamped NPN phase splitter device 34 selectively applies output drive current provided by an output drive current source resistor 36 to either a Schottky-clamped NPN active load driver device 38 or to a Schottky-clamped NPN active drive device 40, depending upon the state of the input circuit 20. More particularly, the phase splitter device 34 will assume a non-conducting state when the input device 24 of the input circuit 20 is in the conducting state and shunting all of the phase splitter drive current provided by the phase splitter drive current source resistor 26 to the ground terminal 18. In the non-conducting state of the phase splitter device 34, substantially all of the output drive current provided by the output drive current source resistor 36 is applied to the active load driver device 38. On the other hand, the phase splitter device 34 will assume a conducting state when the input device 24 of the input circuit 20 is in the non-conducting state, so that all of the phase splitter drive current is applied via the phase splitter driver diode 28 to the phase splitter device 34. In the conducting state of the phase splitter device 34, substantially all of the output drive current is applied to the active drive device 40.

In response to the output drive current applied thereto when the phase splitter device 34 is in the non-conducting state, the active load driver device 38 will assume a conducting state and provide active load drive current for an NPN active load device 42. In response to the active load drive current, the active load device 42 will assume a conducting state and will source output current to the output terminal 12 at a voltage very close to that applied by the power source (not shown) to the power terminal 16. In the preferred form of such circuits, an output current limiter resistor 44 is interposed between the power terminal 16 and the active load device 42 to establish a maximum output current level, and a pull-down resistor 46 is interposed between the ground terminal 18 and the base of the active load device 42 to improve the response time of the active load device 42 to changes in the state of the active load driver device 38.

In response to the output drive current applied thereto when the phase splitter device 34 is in the conducting state, the active drive device 40 will assume a conducting state and sink output current from the output terminal 12 at a voltage substantially the same as that applied by the power source (not shown) to the ground terminal 18. In the preferred form of such circuits, a "Baker" clamping circuit 48, comprised of an NPN clamp device 50, a base resistor 52 and a collector resistor 54, is interposed between the ground terminal 18 and the base of the active drive device 40 to improve the response characteristics of the active drive device 40.

In one preferred form of the logic circuit 10, a disable circuit 56 is provided to selectively disable the operation of the output circuit 22 by forcing the active load device 42 and the active drive device 40 simultaneously into the non-conducting state. In a typical form of the disable circuit 56, a Schottky-clamped NPN disable device 58, provided with disable drive current via a disable drive current source resistor 60, will assume a non-conducting state in response to a relatively high voltage disable signal applied to a disable terminal 62, so that the output drive current provided by the output drive current source resistor 36 is available for application to either the active load driver device 38 or to the active drive device 40 under the selective control of the phase splitter device 34. On the other hand, the disable device 58 will assume a conducting state in response to a relatively low voltage disable signal applied to the disable terminal 62, so that the output drive current provided by the output drive current source resistor 36 is shunted to the disable terminal 62, forcing the active load driver device 38 into the non-conducting state. Similarly, a second Schottky-clamped NPN transistor 64, provided with disable drive current via a disable drive current resistor 66, will assume a non-conducting state in response to a relatively high voltage disable signal applied to the disable terminal 62, so that the phase splitter drive current provided by the phase splitter drive current source resistor 26 is available for application to the phase splitter device 34 under the control of the input device 24. On the other hand, the disable device 64 will assume a conducting state in response to a relatively low voltage disable signal applied to the disable terminal 62, thereby shunting substantially all of the phase splitter drive current to the disable terminal 62, and forcing the phase splitter device 34 into the non-conducting state. Thus, both the active load device 42 and the active drive device 40 are forced simultaneously into the non-conducting state, and the output terminal 12 is placed into the high impedance state.

Although the logic circuit 10 has been generally satisfactory in many applications, the relatively high power dissipation of the logic circuit 10 in the disabled state is often undesirable. The logic circuit 10 is also limited to operation in the three-state mode, although many applications require operation in the open collector mode. In addition, it can be demonstrated that rapid changes in voltage at the output terminal 12 capacitively induce brief surges of drive current into the base of the active drive device 40, due to a phenomenon generally referred to as the Miller effect. For example, the transition of the active load device 42 from the non-conducting state to the conducting state, following the transition of the phase splitter device 34 from the conducting state to the non-conducting state, is often rapid enough to capacitively produce sufficient drive current to maintain the active drive device 40 in the conducting state for a brief period of time after the phase splitter device 34 has substantially assumed the non-conducting state. As a result, the active load device 42 must source a greater level of output current until the active drive device 40 actually assumes the non-conducting state. A similar problem arises in those applications where it is desired to couple the output terminal 12 to a communication bus (not shown) which is shared with other logic circuits. In this form, it is conventional to place all but one of the transmitting circuits in the disabled state to prevent transmission conflicts between circuits. However, even in the disabled state, the Miller-induced conduction of the active drive device 40 will impose a brief but significant current load on the transmitting circuit during each positive change in voltage at the output terminal 12.

A related logic circuit which exhibits one or more of these problems is described in the attached copy of U.S. Pat. No. 3,999,080. One other related logic circuit with some of these problems is described in the attached Preliminary Data Sheet on the Texas Instruments Octal General-Purpose Interface Bus Transceivers, Types SN75160 and SN75161.

SUMMARY OF THE INVENTION

In a logic circuit, switch means are provided, generally between the active load driver device and the active load device, for preventing the application of active load drive current to the active load device by the active load driver device, in response to receiving a load disable signal. Thus, the active load device is forced into the non-conducting state, so that the logic circuit operates in the open collector mode. In the absence of the load disable signal, the switch means are controlled by the logic circuit to enable operation in the three-state mode.

Other objects and advantages of the present invention will be evident from the following detailed description, when read in conjunction with the accompanying drawings.

BRIEF DESCRIPTION OF THE DRAWINGS

FIG. 2 is a schematic diagram of a logic circuit constructed in accordance with the preferred form of the present invention.

DESCRIPTION OF THE PREFERRED EMBODIMENT

Figure 1:
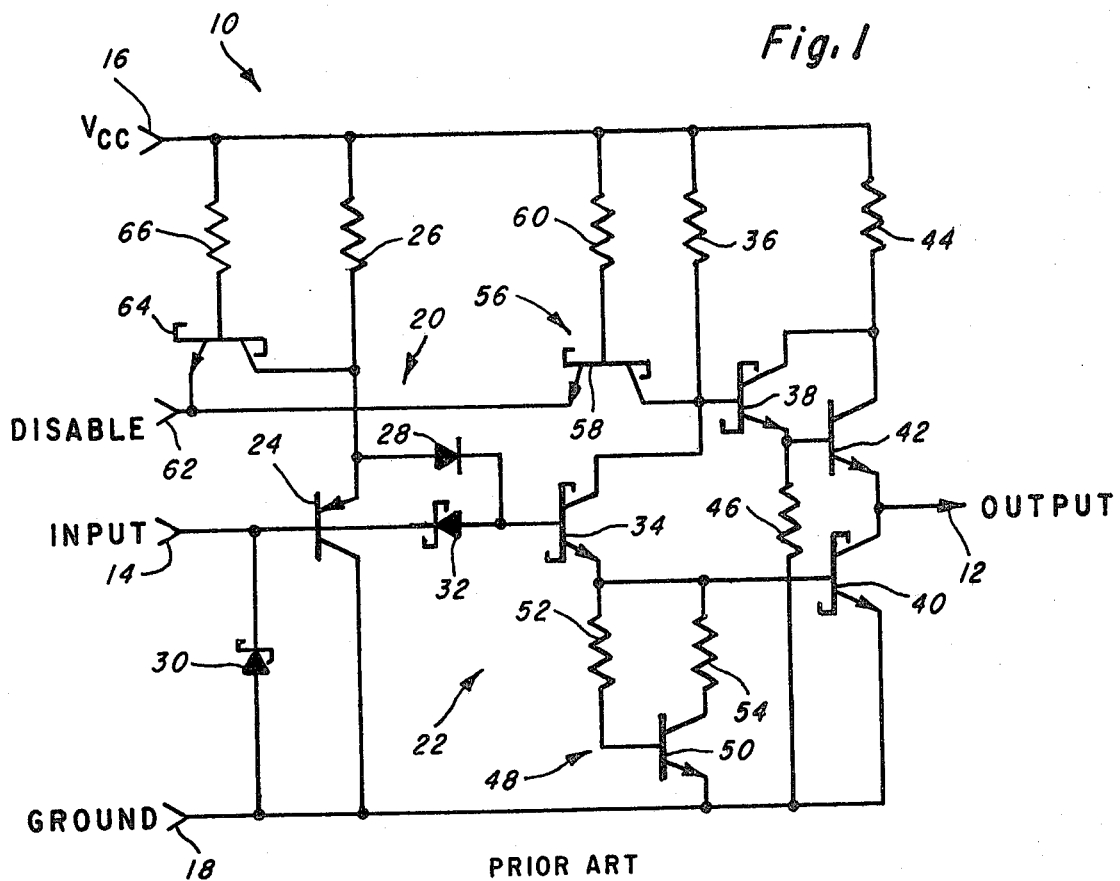
FIG. 1 is a schematic diagram of a preferred form of one prior art logic circuit.

Shown in FIG. 2 is an improved logic circuit 68 constructed in accordance with the preferred embodiment of the present invention to provide a predetermined output signal in response to simultaneously receiving one or or more input signals. In the form shown in FIG. 2, the logic circuit 68 operates as an inverter, in a manner similar to the logic circuit 10 shown in FIG. 1, by applying an output signal to an output terminal 70 which is the logical inverse of an input signal applied to an input terminal 72. As in the logic circuit 10, the logic circuit 68 is supplied with operating power from a power source (not shown) coupled to a power terminal 74 and a ground terminal 76.

In general, the logic circuit 68 is comprised of an input circuit 78 and an output circuit 80. In the input circuit 78, a PNP input device 82 selectively applies phase splitter switch drive current provided by a phase splitter switch drive current source resistor 84 to a Schottky-clamped NPN phase splitter switch device 86, depending upon the input signal applied to the input terminal 72. More particularly, the input device 82 will assume a conducting state in response to a relatively low voltage input signal applied to the input terminal 72, so that substantially all of the phase splitter switch drive current provided by the phase splitter switch drive current source resistor 84 is shunted to the ground terminal 76. On the other hand, the input device 82 will assume a non-conducting state in response to a relatively high voltage input signal applied to the input terminal 72, so that the phase splitter switch drive current is applied to the phase splitter switch device 86. In response to the phase splitter switch drive current, the phase splitter switch device 86 will assume a conducting state and will apply phase splitter drive current provided by a phase splitter drive current source resistor 88 to the output circuit 80. As in the preferred form of the logic circuit 10, a Schottky input clamp diode 90 is interposed between the ground terminal 76 and the input terminal 72 to establish a low voltage input signal clamping level, and a Schottky phase splitter speed-up diode 92 is interposed between the output circuit 80 and the input terminal 72 to improve the response time of the output circuit 80 to changes in the input signal applied to the input terminal 72. In contrast to the logic circuit 10, however, the input circuit 78 of the logic circuit 68 responds substantially more rapidly to changes in the input signal applied to the input terminal 72 since the phase splitter switch drive current provided by the phase splitter switch drive current source resistor 84 is substantially less than the phase splitter drive current provided by the phase splitter drive current source resistor 26, thereby substantially reducing the current loading of the input device 82 relative to the input device 24.

In the output circuit 80, a Schottky-clamped NPN phase splitter device 94 selectively applies output drive current provided by an output drive current source resistor 96 to either an NPN active load driver device 98 or to a Schottky-clamped NPN active drive device 100, depending upon the state of the input circuit 78. More particularly, the phase splitter device 94 will assume a non-conducting state when the input device 82 of the input circuit 78 is the conducting state and shunting all of the phase splitter switch drive current to ground. Without drive current, the phase splitter switch device 86 will assume the non-conducting state and will provide no phase splitter drive current. Without drive current, the phase splitter device 94 will assume the non-conducting state so that substantially all of the output drive current provided by the output drive current source resistor 96 is applied to the active load driver device 98. On the other hand, the phase splitter device 94 will assume a conducting state when the input device 82 of the input circuit 78 is in the non-conducting state, thereby placing the phase splitter switch device 86 in the conducting state and applying the phase splitter drive current provided by the phase splitter drive current source resistor 88 to the phase splitter device 94. In the conducting state of the phase splitter device 94, substantially all of the output drive current provided by the output drive current source resistor 96 is applied to the active drive device 100.

In response to the output drive current applied thereto when the phase splitter device 94 is in the non-conducting state, the active load driver device 98 may assume a conducting state and provide active load drive current for an NPN active load device 102. In response to receiving the active load drive current via an active load switch device 104, the active load device 102 will assume a conducting state and will source output current to the output terminal 70 at a voltage very close to that applied by the power source (not shown) to the power terminal 74. As in the logic circuit 10, an output current limiter resistor 106 is interposed between the power terminal 74 and the active load device 102 to establish a maximum output current load, and a pull-down resistor 108 is interposed between the ground terminal 76 and the base of the active load device 102 to improve the response time of the active load device 102 to changes in the state of the active load driver device 98. In addition, a Schottky active load speed-up diode 110 is interposed between the base of the active load device 102 and the collector of the phase splitter device 94 to further improve the response time of the active load device 102 to changes in the state of the phase splitter device 94.

In response to the output drive current applied thereto when the phase splitter device 94 is in the conducting state, the active drive device 100 will assume a conducting state and sink output current from the output terminal 70 at a voltage substantially the same as that applied by the power source (not shown) to the ground terminal 76. As in the logic circuit 10, a "Baker" clamping circuit 112, comprised of an NPN transistor 114, a base resistor 116 and a collector resistor 118, is interposed between the ground terminal and the base of the active drive device 100 to improve the response characteristics of the active drive device 100.

In the preferred form of the logic circuit 68, an improved disable circuit 120 is provided to selectively disable the operation of the output circuit 80 by forcing the active load device 102 and the active drive device 100 simultaneously into the non-conducting state. In the preferred form of the disable circuit 120, a multi-emitter NPN active load switch driver device 122, provided with active load switch driver current via an active load switch driver current source resistor 124, will assume a non-conducting state in response to a relatively high voltage disable signal applied to a disable terminal 126. In this condition, the phase splitter device 94 controls the application of active load switch drive current, provided by an active load switch drive current source resistor 128, to the active load switch device 104, via one of the emitters of the active load switch driver device 122. Thus, when the phase splitter device 94 is in the non-conducting state, the active load switch device 104 will assume a conducting state and apply the active load drive current provided by the active load driver device 98 to the active load device 102. However, when the phase splitter device 94 is in the conducting state, the active load switch driver device 122 will assume a conducting state and apply the active load switch drive current provided by the active load switch drive current source resistor 128 to the active drive device 100. Similarly, the active load switch driver device 122 will assume a conducting state in response to a relatively low voltage disable signal applied to the disable terminal 126, so that the active load switch drive current is shunted to the disable terminal 126. Under either of these conditions, the active load switch device 104 will assume a non-conducting state and prevent the application of any active load drive current by the active load driver device 98 to the active load device 102.

The improved disable circuit 120 also includes a Schottky disable diode 130, interposed between the base of the phase splitter switch device 86 and the disable terminal 126, which shunts substantially all of the phase splitter switch drive current provided by the phase splitter switch drive current source resistor 84 to the disable terminal 126 in response to a relatively low voltage disable signal applied to the disable terminal 126. As a result, the phase splitter switch device 86, the phase splitter device 94, and the active drive device 100 each assume the non-conducting state and the output terminal 70 is placed in a high impedance state. In the preferred form of the disable circuit 120, a Schottky phase splitter disable diode 132 is interposed between the base of the phase splitter device 94 and the disable terminal 126 to improve the response time of the phase splitter device 94 to changes in the disable signal applied to the disable terminal 126. Although accomplishing the same result as the disable circuit 56 in the logic circuit 10, the improved disable circuit 120 reduces the power dissipation of the logic circuit 68 in the disabled state since the sum of the currents provided the resistors 84, 124 and 128 is less than the sum of the currents provided by the resistors 36, 60 and 66.

Although the logic circuit 68 has been described above as operating in the well known three-state mode, the logic circuit 68 can also operate in the conventional open collector mode by selectively actuating the portion of the disable circuit 120 that controls the flow of active load drive current from the active load driver device 98 to the active load device 102. More particularly, the active load switch driver device 122 is provided with an additional emitter which is connected to a load disable terminal 134. In response to a relatively low voltage load disable signal applied to the load disable terminal 134, the active load switch driver device 122 will assume the conducting state, and the active load switch device 104 will assume the non-conducting state. In this condition, the active load switch device 104 prevents the application to the active load device 102 of any of the active load drive current which would otherwise be provided by the active load driver device 98. In response to a relatively high voltage load disable signal applied to the load disable terminal 134, the disable circuit 120 will operate as described above.

In the preferred form, the logic circuit 68 includes a dynamic Miller shunt 136 for rapidly placing the active drive device 100 in the non-conducting state each time the phase splitter device 94 assumes the non-conducting state. In particular, the dynamic Miller shunt 136 is comprised of a PN dynamic Miller drive diode 138 for briefly providing Miller shunt drive current in response to the phase splitter device 94 assuming the non-conducting state, and a Schottky-clamped NPN Miller shunt device 140 for shunting any drive current received by the active drive device 100 to the ground terminal 76 in response to receiving Miller shunt drive current from the dynamic Miller drive diode 138. By combining the inherent capacitance of the dynamic Miller drive diode 138 with a pull-down resistor 142, interposed between the ground terminal 76 and the base of the Miller shunt device 140, a differentiator is formed which is responsive to each transition of the phase splitter device 94 from the conducting state to the non-conducting state. By selecting appropriate values for the capacitance of the dynamic Miller drive diode 138 and the resistance of the pull-down resistor 142, the duration of the time period during which the Miller shunt device 140 will be actively shunting drive current away from the active drive device 100 can be made commensurate with the time required for the active load device 102 to transition from the non-conducting state to the conducting state. In this manner, the rapid rise in voltage at the output terminal 70 resulting from the active load device 102 assuming the conducting state is prevented from temporarily maintaining the active drive device 100 in the conducting state.

The preferred form of the logic circuit 68 also includes an active Miller shunt 144 for maintaining the active drive device 100 in the non-conducting state in response to the disable signal applied to the disable terminal 126. In particular, the active Miller shunt 144 is comprised of an active Miller shunt drive circuit 146 for providing Miller shunt drive current in response to a relatively low voltage disable signal applied to the disable terminal 126, and the Schottky-clamped NPN Miller shunt device 140 for shunting any drive current received by the active drive device 100 to the ground terminal 76 in response to receiving Miller shunt drive current from the active Miller shunt drive circuit 146.

In the active Miller shunt drive circuit 146, a Schottky diode 148 selectively applied inverter drive current provided by an inverter drive current source resistor 150 to a Schottky-clamped NPN inverter device 152, depending upon the disable signal applied to the disable terminal 126. More particularly, the Schottky diode 148 will assume a non-conducting state in response to a relatively high voltage disable signal applied to the disable terminal 126, so that substantially all of the inverter drive current provided by the inverter drive current source resistor 150 is applied to the inverter device 152. In response to the inverter drive current, the inverter device 152 will assume a conducting state and will shunt substantially all of the active Miller shunt driver current provided by an active Miller shunt driver current source resistor 154 to the ground terminal 76 via a PN diode 156. In this condition, substantially none of the Miller shunt drive current provided by an active Miller shunt drive current source resistor 158 will be applied to the Miller shunt device 140 via an active Miller shunt driver device 160. On the other hand, the Schottky diode 148 will assume a conducting state in response to a relatively low voltage disable signal applied to the disable terminal 126, so that substantially all of the inverter drive current provided by the inverter drive current source resistor 150 is shunted to the disable terminal 126. Under these conditions, the inverter device 152 will assume a non-conducting state, so that the active Miller shunt driver current provided by the active Miller shunt driver current source resistor 154 is applied to the active Miller shunt driver device 160. In response to the active Miller shunt driver current, the active Miller shunt driver device 160 will assume a conducting state and will apply the Miller shunt drive current provided by the active Miller shunt drive current source resistor 158 to the Miller shunt device 140. In this mode of operation, the pull-down resistor 142, interposed as it is between the ground terminal 76 and the base of the Miller shunt device 140, improves the response time of the Miller shunt device 140 to changes in the state of the active Miller shunt driver device 160.

Although the load disable circuit has been disclosed in detail herein in combination with a particular form of logic circuit, it will be clear to those skilled in the art that the invention may be advantageously employed in other types of logic circuits. It is intended therefore that variations or changes that may be made in the arrangement or construction of the parts or elements of the load disable circuit to adapt the circuit to other uses be considered within the scope of the present invention as defined in the appended claims.

What is claimed is:

1. In a logic circuit comprising:

Input means coupled to an input terminal, said input means for providing phase splitter drive current in response to a predetermined input signal applied to the input terminal;

active load means coupled to an output terminal, said active load means for sourcing output current to the output terminal in response to receiving active load drive current;

active load driver means for providing active load drive current in response to receiving output drive current;

active drive means coupled to the output terminal, said active drive means for sinking output current from the output terminal in response to receiving output drive current; and phase splitter means coupled to the active drive means and to the active load driver means, said phase splitter means for applying output drive current to the active drive means in response to receiving phase splitter drive current, and applying output drive current to the active load driver means in response to receiving no phase splitter drive current;

a load disable circuit comprising; switch means coupled to a load disable terminal, to the active load driver means and to the active load means, said switch means for preventing the application of active load drive current by the active load driver means to the active load means in response to a predetermined load disable signal applied to the load disable terminal, and for allowing the application of active load drive current by the active load driver means to the active load means in the absence of said predetermined load disable signal, wherein said switch means comprises;

active load switch driver means coupled to the load disable terminal, the active load switch driver means providing active load switch drive current in the absence of the predetermined load disable signal; and an active load switch device coupled to the active load switch driver means and interposed between the active load driver means and the active load means, the active load switch device applying any active load drive current provided by the active load driver means to the active load means in response to receiving active load switch drive current from the active load switch driver means.

2. The logic circuit of claim 1, wherein the active load switch driver means comprises:

active load switch drive current means coupled to the active load switch device, the active load switch drive current means providing the active load switch drive current; and an active load switch driver device coupled to the load disable terminal, to the active load switch drive current means and to the active load switch device, the active load switch driver device preventing the application of active load switch drive current by the active load switch drive current means to the active load switch device in response to the predetermined load disable signal.

* * * * *